(12) United States Patent
Chen

(10) Patent No.: US 7,336,521 B2
(45) Date of Patent: Feb. 26, 2008

(54) MEMORY PUMPING CIRCUIT

(75) Inventor: Chieng-Chung Chen, Hsin-Chu (TW)

(73) Assignee: Winbond Electronics Corp. (TW)

( * ) Notice: Subject to any disclaimer, the term of this patent is extended or adjusted under 35 U.S.C. 154(b) by 0 days.

(21) Appl. No.: 10/696,525

(22) Filed: Oct. 29, 2003

(65) Prior Publication Data
US 2004/0213034 A1 Oct. 28, 2004

(30) Foreign Application Priority Data
Apr. 23, 2003 (TW) .............................. 92109523 A

(51) Int. Cl.
*G11C 11/24* (2006.01)
*G11C 5/14* (2006.01)

(52) U.S. Cl. ................. 365/149; 365/226; 365/230.06; 365/233

(58) Field of Classification Search ................ 365/145, 365/149, 226, 230.06, 233, 200; 326/97; 438/238
See application file for complete search history.

(56) References Cited

U.S. PATENT DOCUMENTS

| | | | | |
|---|---|---|---|---|
| 4,532,611 A | * | 7/1985 | Countryman, Jr. | 365/200 |
| 5,297,077 A | * | 3/1994 | Imai et al. | 365/145 |
| 5,363,325 A | * | 11/1994 | Sunouchi et al. | 365/149 |
| 5,453,707 A | * | 9/1995 | Hiratsuka et al. | 326/97 |
| 5,796,670 A | * | 8/1998 | Liu | 365/149 |
| 5,879,980 A | * | 3/1999 | Selcuk et al. | 438/238 |
| 6,075,720 A | * | 6/2000 | Leung et al. | 365/149 |
| 6,101,119 A | * | 8/2000 | Yi et al. | 365/149 |
| 6,147,923 A | * | 11/2000 | Nakano | 365/226 |
| 6,205,067 B1 | * | 3/2001 | Tsukude | 365/149 |
| 6,215,708 B1 | * | 4/2001 | Lien et al. | 365/226 |
| 6,549,449 B2 | * | 4/2003 | Takashima | 365/149 |
| 6,552,357 B2 | * | 4/2003 | Akita | 365/149 |
| 6,735,102 B2 | * | 5/2004 | Keeth et al. | 365/226 |

* cited by examiner

Primary Examiner—Trong Phan
(74) Attorney, Agent, or Firm—Anthony R. Barkume, P.C.

(57) ABSTRACT

A memory pumping circuit is proposed. The feature of the present invention is the charging capacitor of the pumping circuit is a DRAM cell for enhancing the capacitance.

6 Claims, 3 Drawing Sheets

MEMORY PUMPING CIRCUIT

FIELD OF THE INVENTION

The present invention is related to a memory pumping circuit, and particularly to a memory pumping circuit using a DRAM cell to improve the capacitance in the pumping circuit.

BACKGROUND OF THE INVENTION

In most of the semiconductor components, such as low power DRAM or some other low power memories just like 1T-SRAM, the voltage power sources (VPP) of their Word Lines are higher than the operation voltage (Vdd). For example, if Vdd=1.8V and VPP=2.8V, then there are one or more VPP Pumping Circuits to provide the high voltage on the word line.

The pumping circuit of the conventional memory is shown as FIG. 1. The NMOS (N Type Metal Oxide Semiconductor) capacitor 12 is the charging capacitor. The current source 11 of NMOS is used to provide the charge current. A clock signal $\theta_1$ is input to the inverter 13 to generates the clock signal $\theta_2$ for pumping the voltage VPP up to meet the high voltage for the word line need. The conventional memory pumping circuit operates well with the memory operation voltage Vdd=2.5V; but in the case of low power DRAM or 1T-SRAM in which the operation voltage is limited to 1.8V, the driving current will not guarantee these low power memories working on the normal operation. A method to improve the conventional drawback is by increasing the MOS capacitor area to make sure the driving current enough for the VPP output. But, increasing the area of the MOS capacitor will also increase extra manufacture cost. Therefore, this is not a good solution.

SUMMARY OF THE INVENTION

An objective of the present invention is to provide a capacitor of DRAM cell to enhance the capacitance of the pumping circuit.

Another objective of the present invention is to provide a capacitor of DRAM cell to improve the reliability of the pumping circuit.

Another objective of the present invention is to provide a capacitor of DRAM cell to reduce the manufacture and product cost.

According to the present invention, a memory pumping circuit is proposed. The feature of the present invention is the charging capacitor of the pumping circuit is a DRAM cell for enhancing the capacitance.

In accordance with one aspect of the present invention, the DRAM cell consists of a MOS transistor and a storage cell.

In accordance with one aspect of the present invention, the pumping circuit comprises a current source to provide a charge current for the DRAM cell.

In accordance with one aspect of the present invention, the DRAM cell even comprises an output port for providing the pumping voltage source. The output port electrically connects to the current source for getting the charge current.

In accordance with one aspect of the present invention, the pumping voltage source is the voltage source of a word line.

In accordance with one aspect of the present invention, there is a driving circuit for generating a clock signal to the DRAM cell for driving the memory cell.

In accordance with one aspect of the present invention, the driving circuit is an inverter.

In accordance with one aspect of the present invention, the driving circuit consists of a PMOS transistor and a NMOS transistor, and generates the clock signal according to a first clock signal and a second clock signal.

According to the present invention, a memory pumping circuit comprises: a current source for providing a charge current; a DRAM cell of charging capacitor of the pumping circuit having an output port for providing a pumping voltage source and connecting to the current source for receiving the charge current; and a driving circuit for generating a first clock signal to the DRAM cell for driving the DRAM cell.

In accordance with one aspect of the present invention, the DRAM cell consists of a MOS transistor and a storage cell.

In accordance with one aspect of the present invention, the pumping voltage source is the voltage source of word line.

In accordance with one aspect of the present invention, the driving circuit is an inverter.

In accordance with one aspect of the present invention, the driving circuit consists of a PMOS transistor and a NMOS transistor, and generates the clock signal by receiving a second clock signal and a third clock signal.

The present invention may best be understood through the following description with reference to the accompanying drawings, in which:

BRIEF DESCRIPTION OF THE DRAWINGS

FIG. 2 (B) shows another preferred embodiment of the memory's pumping circuit according to the present invention.

DETAILED DESCRIPTION OF THE PREFERRED EMBODIMENT

Figure 1:
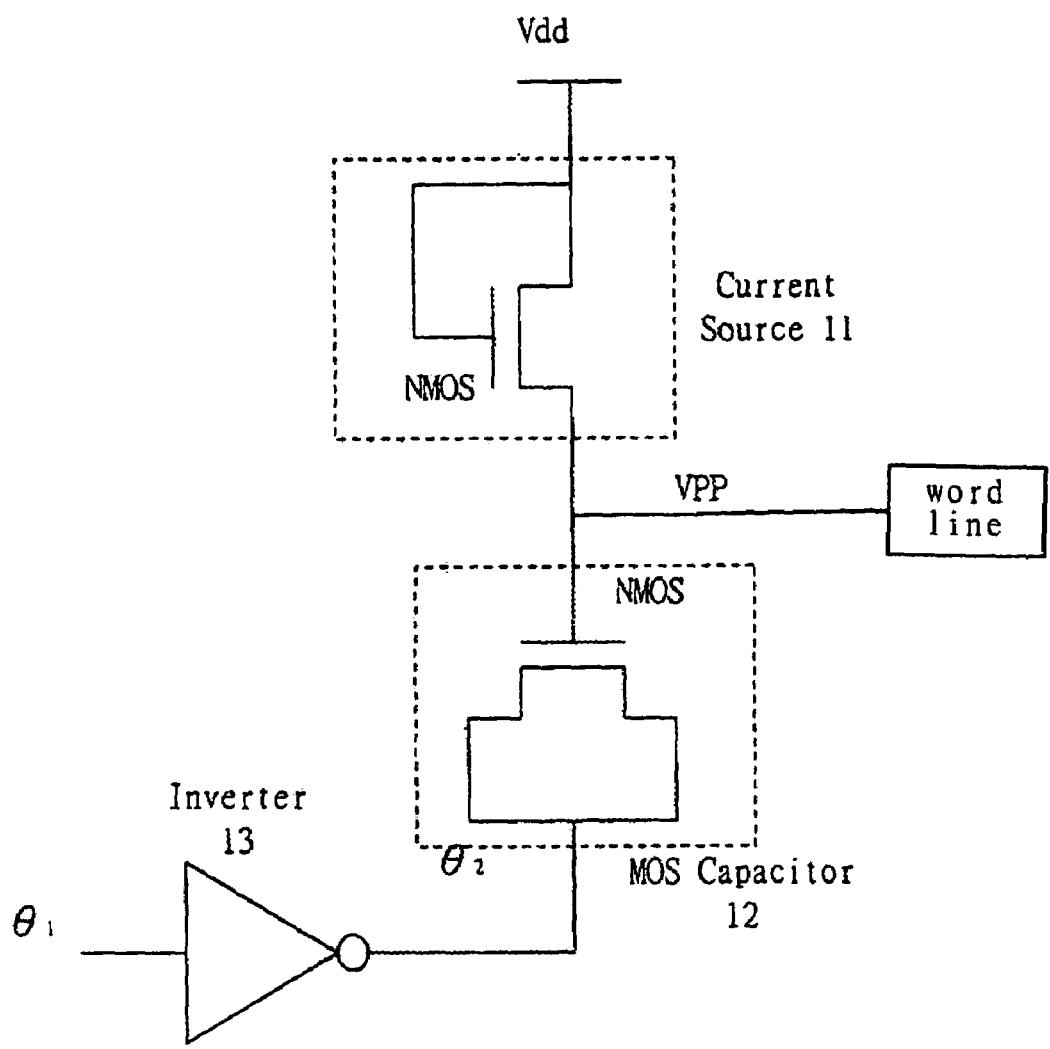
FIG. 1 shows the conventional pumping circuit of the memory.
Figure 1:
Figure 1:
Figure 2A:
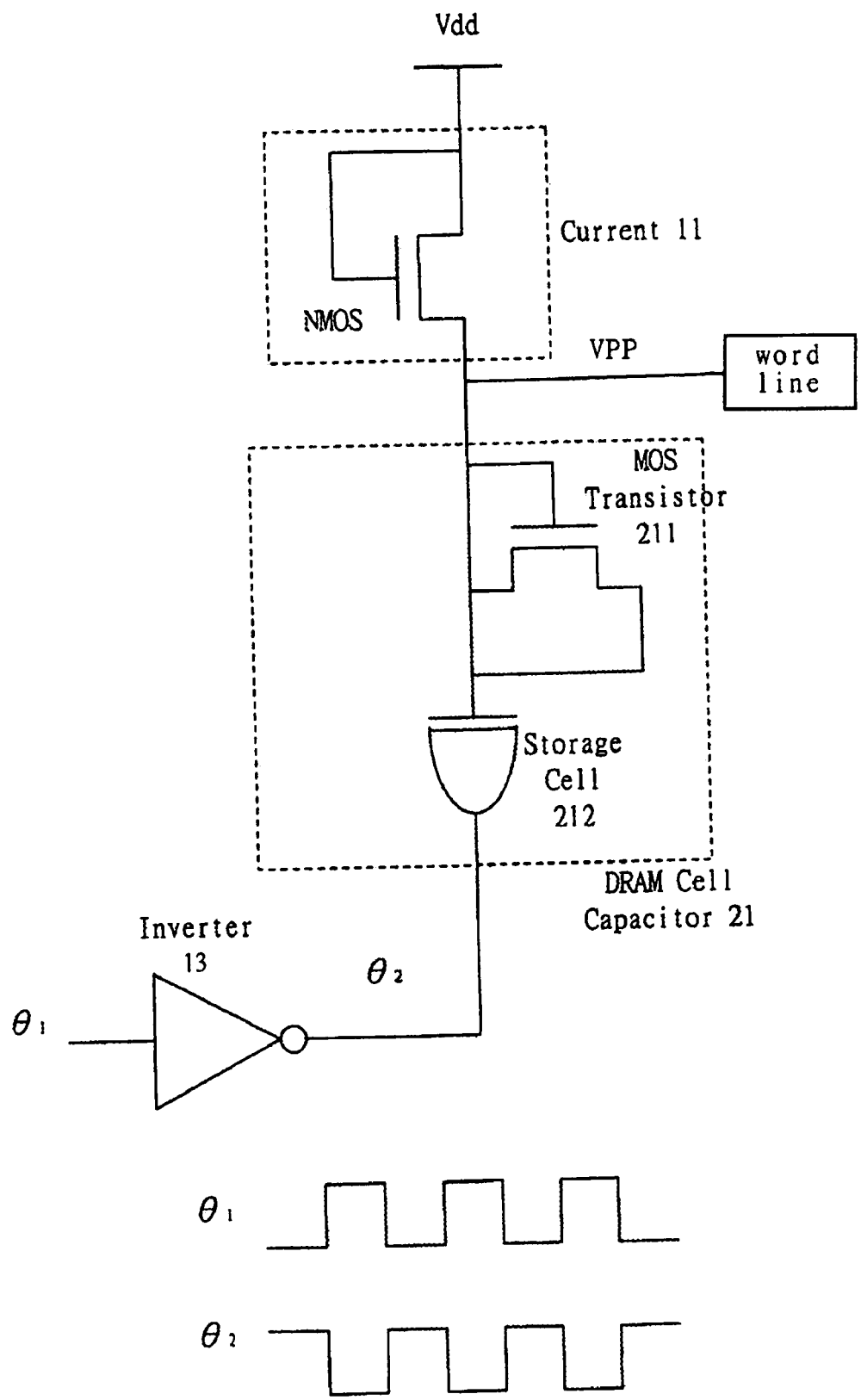
FIG. 2 (A) shows a preferred embodiment of the memory's pumping circuit according to the present invention.

Please refer FIG. 2(A). The memory pumping circuit may apply to a low power memory. The memory capacitor 21 designed by the DRAM cell is a charging capacitor. This memory capacitor 21 comprises a 1T/1S element which consists of a MOS transistor 211 (NMOS in this case) and a storage cell 212. The plate end of the storage cell 212 connects to the output port of a driving circuit (Inverter 13) for receiving the clock signal $\theta_2$ to drive the memory capacitor 21. The clock signal $\theta_1$ is input to the inverter 13 to generate the clock signal $\theta_2$. The other plate end of the storage cell 212 connects to MOS transistor 211. The drain, source and gate of the MOS transistor 211 connect together with the current source 11 for charging and providing the pumping voltage VPP.

Figure 2:
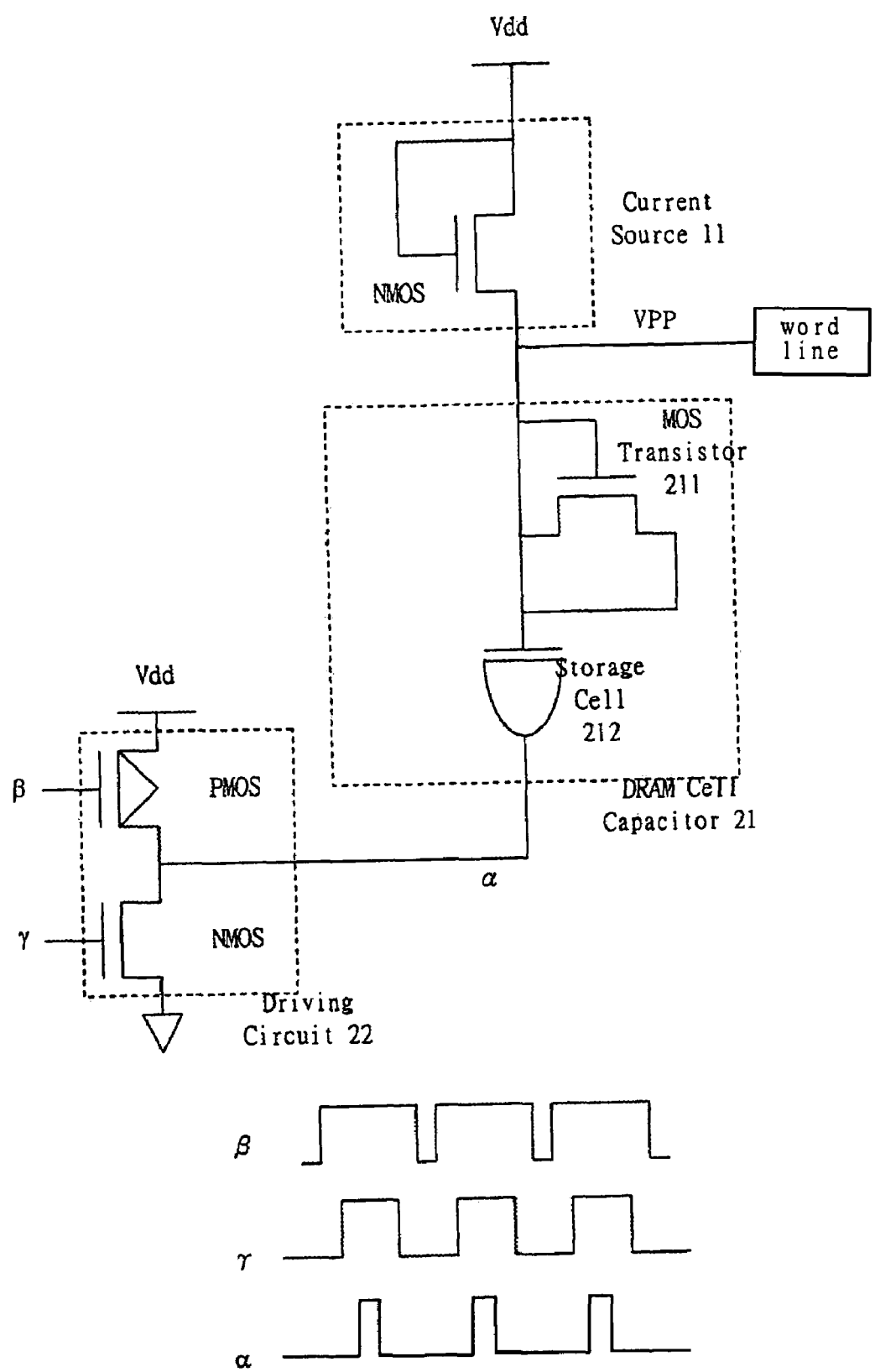

FIG. 2 (B) shows another preferred embodiment according to the present invention. The memory cell capacitor 21 is as well consists of a 1T/1S element. But, the driving circuit providing the clock signal consists of a PMOS transistor and a NMOS transistor. The driving circuit 22 is able to receive the second clock signal β and the third clock signal γ respectively, and output the first clock signal α to the plate end of the storage cell 212 to drive the memory capacitor 21, where the second clock signal β and the third clock signal γ could be different duty cycles and phases to control the operation frequency and operation cycle of the first clock signal α for controlling the voltage value of VPP.

In the present invention, we can use the current DRAM process when the DRAM cell capacitor is manufactured. The DRAM cell is acted as the charging capacitor of the memory's pumping circuit. The improvement of the present invention is, the unit area's capacitance of the DRAM cell is higher than that of the prior arts for more than 50 times ($C_{DRAM\_Cell} > 50 * C_{MOS}$), when we use the DRAM cell as the charging capacitor. The present invention could reduce the capacitor's area of the VPP pumping circuit, it also save the extra process cost by using the current DRAM process as the memory cell to enhance the competition of products. For the quality, the issue of the memory cell reliability will not be happened if the operation voltage Vdd comes down to 1.8V.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory pumping circuit comprising:
   a DRAM cell used as a charging capacitor of the memory pumping circuit for enhancing the capacitance, wherein the DRAM cell comprising a MOS transistor and a storage capacitor;
   a current source coupled to the DRAM cell for providing a charge current to the DRAM cell;
   a node located between the current source and the DRAM cell for providing a pumping voltage used as a voltage source of a word line, and
   a driving circuit for generating a clock signal to drive the DRAM cell;
   wherein the MOS transistor has a source, a drain, and a gate connected together to the node and to one plate of the storage capacitor, and
   wherein another plate of the storage capacitor is connected to receive the clock signal of the driving circuit.

2. The memory pumping circuit according to claim 1, wherein said driving circuit is an inverter.

3. The memory pumping circuit according to claim 1, wherein the driving circuit comprises a PMOS transistor and a NMOS transistor, and generates the clock signal according to a first clock signal and a second clock signal.

4. A memory pumping circuit comprises:
   a current source for providing a charge current;
   a DRAM cell as a charging capacitor of the pumping circuit, the DRAM cell having an output port for providing a pumping voltage used as a voltage source of a word line, the output port coupled to the current source for receiving the charge current, wherein the DRAM cell comprising a MOS transistor and a storage capacitor; and
   a driving circuit for generating a first clock signal to the DRAM cell for driving the DRAM cell;
   wherein the MOS transistor has a source, a drain, and a gate connected together to the output port of the DRAM cell and to one plate of the storage capacitor, and
   wherein another plate of the storage capacitor is connected to receive the first clock signal of the driving circuit.

5. The memory pumping circuit according to claim 4 wherein the driving circuit is an inverter.

6. The memory pumping circuit according to claim 4 wherein the driving circuit comprises a PMOS transistor and a NMOS transistor, and generates the first clock signal according to a second clock signal and a third clock signal.

* * * * *